Figure 1:
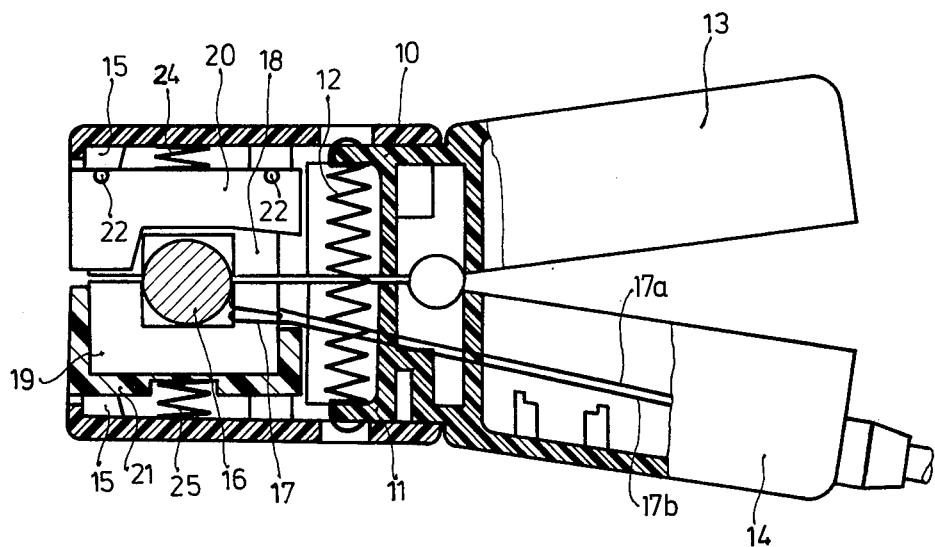

United States Patent [19]

Heilmann et al.

[11] 4,005,380
[45] Jan. 25, 1977

[54] CLIP-ON INDUCTIVE PULSE PICK-UP

[75] Inventors: Wolfgang Heilmann, Weinstadt;
Kurt Groetzner; Bernhard Frohnwieser, both of Stuttgart, all of Germany

[73] Assignee: Robert Bosch G.m.b.H., Stuttgart, Germany

[22] Filed: May 19, 1976

[21] Appl. No.: 687,748

[30] Foreign Application Priority Data

June 12, 1975 Germany .......................... 2526302
Feb. 20, 1976 Germany .......................... 2606868

[52] U.S. Cl. ................................ 336/84; 324/127; 336/176
[51] Int. Cl.² .................. H01F 15/04; H01F 27/26
[58] Field of Search .................... 336/84, 176, 210; 324/127, 117 R, 117 H, 129, 149

[56] References Cited

FOREIGN PATENTS OR APPLICATIONS 327,837  4/1930  United Kingdom ............... 324/127

*Primary Examiner*—Thomas J. Kozma
*Attorney, Agent, or Firm*—William R. Woodward

[57] ABSTRACT

The halves of a ferrite core respectively set in the jaws of a pick-up clip are held in plastic holders loosely mounted in the respective clip jaws with compression springs between the holders and the jaws that are weaker than the spring that pulls the clip jaws together. This arrangement enables the core halves to accommodate to each other to produce a flush fit and reduces the impact on closing the clip which the main spring would otherwise produce. A conducting coating is provided for electrical shielding against stray fields.

5 Claims, 2 Drawing Figures

CLIP-ON INDUCTIVE PULSE PICK-UP

This invention relates to a clip-on inductive pulse detector for detecting current pulses in an electric conductor, such as a wire of an engine ignition system, and generating a trigger pulse in response to a detected pulse in the conductor. Clip-on inductive pulse detectors for this purpose are known that are provided with a pair of clip jaw shells hinged together and extending on the other side of the hinge to clip-opening handles, a tension spring arranged to move the jaw shells together and a ferrite core in two separate halves that are mounted respectively in recesses in the respective jaw shells, the core halves being shaped so as to fit together and to surround an electric conductor when the jaw shells are closed onto the conductor. A winding is provided on one of the halves, with connection leads extending through one of the handles.

In clip-on inductive pulse detectors of this type, it is important for the success of the measurements and tests for which they are used that the two ferrite core halves should fit together without an air gap between them, because only then can a reliable trigger pulse be obtained without difficulty.

In the known clip-on inductive pulse detectors of this type, the ferrite core halves are fixed on to the jaw shells of the clip, for example affixed by an adhesive. When the jaw shells are clipped together, it can happen that opposed surfaces of the ferrite core slam together so hard that the ferrite core, which is extraordinarily brittle, breaks up and part of it breaks off. If that happens, the pulse detecting clip becomes unuseable. It can also happen that the two contact surfaces of the respective ferrite core halves do not lie flush against each other, but on account of manufacturing tolerances or small displacements in setting the cores in the jaw shells, become canted so that only an edge of one rests against the surface of the other. This is also undesirable, since it may lead to breaking off the edges of the ferrite core and to causing a substantial air gap to arise between the opposed halves of the core.

It is an object of the present invention to provide a clip-on inductive pulse detector in which the above described disadvantages are avoided and, in particular, to provide a clip-on inductive pulse detector in which a relatively soft clapping of the ferrite core halves against each other can be performed. It is a further object to provide a clip-on inductive pulse detector in which the ferrite core halves can accommodate themselves to each other for a good fit when the clip is closed.

SUMMARY OF THE INVENTION

Briefly, at least one of the core halves is mounted in its jaw shell with a compression spring between it and the jaw shell and is movable against the compression spring by the force of the spring that tends to move the jaws together to close the clip. Preferably both core halves are so mounted in their respective jaw shells. In a particularly advantageous form of the invention, each core half is held in a synthetic resin holder which is loosely positioned in the jaw shell with the help of stop devices that prevent the compression spring from expelling the holder from the jaw shell. These stop devices are preferably projections formed on the holder extending into lateral cavities on the inside of the jaw shell.

In a particularly useful form of the invention, an electrically conducting coating is provided on the synthetic resin holders in which the ferrite core halves are set for shielding against disturbing signals that could have effect on the winding of the core. Preferably such a coating is also providing on the core (taking care not to provide a short-circuiting turn around it) and, likewise, around the winding, and so on, these conductive coatings being preferably connected to shielding provided on the leads to the winding.

Figure 2:
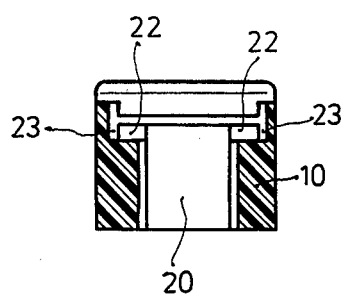

The invention is further described by way of illustrative example with reference to the accompanying drawing, in which:

FIG. 1 is a diagrammatic side view, mostly in section, of a clip-on inductive pulse detector in accordance with the invention, and FIG. 2 is a front view, partly in section, of one jaw of the clip-on pulse detector of FIG. 1.

The clip-on pulse detector or transducer shown in FIG. 1 has two jaw shells 10 and 11 that are held together by the force of a helical tension spring 12. Pressure on the handle extensions can overcome the pull of the spring 12 to open the front ends 15 of the clip, so that the pulse detector can be slipped over an electrical conductor, for example an ignition wire 16 of an ignition system of an internal combustion engine (not shown). The picking up of an electrical signal is effected by a coil 17 wound on a ferrite core 18, 19. This ferrite core 18, 19 is divided into two parts, the core half 18 held in a synthetic resin holder 20 and the half 19 held in another synthetic resin holder 21. The holder 20 with the ferrite core half 18 is mounted in the jaw shell 10 and the holder 21 with the ferrite core half 19, likewise in the jaw shell 11. The ferrite core halves 18 and 19 may, for example, be held in their respective holders 20 and 21 by affixation therein with an adhesive.

As shown in FIG. 2, the holders 20 and 21 are equipped with projections 22 that extend into cavities 23 of the jaw shells 10 and 11 where they are loosely contained. Helical compression springs 24 and 25 are inserted between the respective holders 20 and 21 and the jaw shells 10 and 11, the projections 22 acting as stop members to prevent the compression springs from expelling the holders 20 and 21 and the ferrite core halves 18 and 19, which they respectively hold, out of the respectively shells 10 and 11. The loose fit of the synthetic material holders 20 and 21 and their respective ferrite core halves 18 and 19 provides relatively free movement of the ferrite core halves 18 and 19, so that these can readily accommodate themselves to each other when the clip is closed. The force of the helical compression springs 24 and 25 is less than that of the tension spring 12. When the front end 15 of the jaw shells 10 and 11 close, the facing surfaces of the ferrite core halves 18 and 19 are placed one against the other, and the ferrite core halves 18 and 19 are pressed back with their plastic holders 20 and 21 into the jaw shells 10 and 11 respectively against the force of the compression springs 24 and 25. Since in this fashion the full force of the tension spring 12 does not operate directly against the two ferrite core halves, the latter are not exposed to risk of breakage. Moreover, the loose seating allowed by the projections 22 in the cavities 23 assures that relative canting of the ferrite core halves with respect to each other and the breaking off of portions thereof in consequence is not possible in this device.

In order to obtain better immunity to electrical disturbance and to exclude the possibility of false measurement from such sources, the plastic holders 20 and 21 in which the ferrite core halves 18 and 19 are held should be provided with an electrically conducting coating. Such a coating can be applied effectively either chemically or electrolytically. Many metallized coatings are knwon and they do not need to be further described here. If desired, an additional layer or layers may be provided in a known way to make the metallized coating capable of receiving a soldered connection thereto. The electrically conducting coating is preferably connected to a shield (not shown) on the leads 17a and 17b of the coil 17. The coating can, however, be separately connected to equipment ground or to a separate ground lead instead. The shielding just described produces a safe and reliable shielding against electrical and magnetic fields, as well as stray capacitive effects.

The shielding can be still further improved if all holding and shell portions of the device, at least so far as they surround the ferrite core halves 18, 19, the coil 17 and the electrical leads 17a and 17b are provided with an electrically conducting coating. It is desirable, however, to omit coating the inner (central hole) circumference of the ferrite core and of the portion of its winding thereon, or otherwise to prevent the sensitivity of the pick-up from being reduced by the presence of a short-circuited turn around the core.

Although the invention has been described with reference to a particular illustrative example, it will be understood that modifications and variations may be made within the inventive concept.

We claim:

1. A clip-on inductive pulse detector for detecting current pulses in an electric conductor and generating a trigger pulse in response thereto, comprising a pair of clip jaw shells provided with clip-opening handles, a hinge, a first spring arranged to move the jaw shells together, a ferrite core in two separate halves mounted respectively in recesses in said respective jaw shells, said core halves being shaped so as to fit together and to surround an electric conductor when said jaw shells are closed thereover, and a winding provided on said ferrite core having leads for connection to an electrical circuit, and also comprising the improvement wherein:

at least one of said core halves (18, 19) is mounted with a compression spring (24 and/or 25) held between it and the jaw shell in which it is mounted and is movable against said compression spring by the force of said first spring (12) when the jaw shells (10, 11) are closed together.

2. A clip-on inductive pulse detector as defined in claim 1, in which said core half or halves mounted movably against a compression spring is set in a holder (20, 21) made of synthetic material that is loosely held in a cavity (23) in the corresponding jaw shell with the assistance of stop means (22) for preventing said compression spring from expelling the holder from the corresponding jaw shell.

3. A clip-on inductive pulse detector as defined in claim 2, in which said holder or holders (20, 21) are at least partly provided with an electrically conducting coating for shielding against electrical disturbances.

4. A clip-on inductive pulse detector as defined in claim 2, in which said core halves, the winding 17 of said core and the leads thereof and the holder or holders and jaw shells surrounding them are all provided with an electrically conducting coating.

5. A clip-on inductive pulse detector as defined in claim 4, in which said electrically conducting coatings are connected to a shield provided on the leads to said winding of said core.

* * * * *